United States Patent
Callan et al.

(10) Patent No.: US 7,376,260 B2
(45) Date of Patent: May 20, 2008

(54) METHOD FOR POST-OPC MULTI LAYER OVERLAY QUALITY INSPECTION

(75) Inventors: Neal Callan, Lake Oswego, OR (US); Nadya Belova, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 588 days.

(21) Appl. No.: 11/011,384

(22) Filed: Dec. 14, 2004

(65) Prior Publication Data

US 2005/0100802 A1 May 12, 2005

Related U.S. Application Data

(63) Continuation-in-part of application No. 10/155,620, filed on May 22, 2002, now Pat. No. 7,035,446.

(51) Int. Cl.
*G06K 9/00* (2006.01)
(52) U.S. Cl. .................. 382/144; 382/149; 700/110; 700/121; 716/21
(58) Field of Classification Search .............. 382/144, 382/141, 145, 149; 716/4, 19, 20, 21; 700/110, 700/121
See application file for complete search history.

(56) References Cited

U.S. PATENT DOCUMENTS

| | | | | |
|---|---|---|---|---|
| 6,078,738 A * | 6/2000 | Garza et al. | | 716/21 |
| 6,081,659 A * | 6/2000 | Garza et al. | | 716/21 |
| 6,263,299 B1 * | 7/2001 | Aleshin et al. | | 703/5 |
| 6,911,285 B2 * | 6/2005 | Aleshin et al. | | 430/5 |
| 7,035,446 B2 * | 4/2006 | Medvedeva et al. | | 382/144 |
| 7,149,340 B2 * | 12/2006 | Filseth et al. | | 382/144 |
| 7,325,223 B2 * | 1/2008 | Hu et al. | | 716/19 |
| 2004/0049760 A1 * | 3/2004 | Garza et al. | | 716/19 |
| 2006/0117292 A1 * | 6/2006 | Rodin et al. | | 716/19 |
| 2006/0273242 A1 * | 12/2006 | Hunsche et al. | | 250/208.1 |
| 2007/0079277 A1 * | 4/2007 | Golubtsov et al. | | 716/19 |
| 2007/0143734 A1 * | 6/2007 | Uzhakov et al. | | 716/20 |

* cited by examiner

*Primary Examiner*—Gregory M Desire
(74) *Attorney, Agent, or Firm*—Suiter Swantz PC LLO

(57) ABSTRACT

A method for performing post-optical proximity correction (OPC) multi layer overlay quality inspection includes the steps of generating a virtual target mask for a first mask and a second mask overlay using design rules at least partially defining the relationship between the first mask and the second mask; creating a composite aerial image representing a first mask image formed from the first mask and a second mask image formed by the second mask by performing imaging of the first mask and the second mask and overlaying the second mask image onto the first mask image; generating an overlay image map of the composite aerial image using the design rules at least partially defining the relationship between the first mask and the second mask; and comparing the overlay image map area and the virtual target mask area.

21 Claims, 5 Drawing Sheets

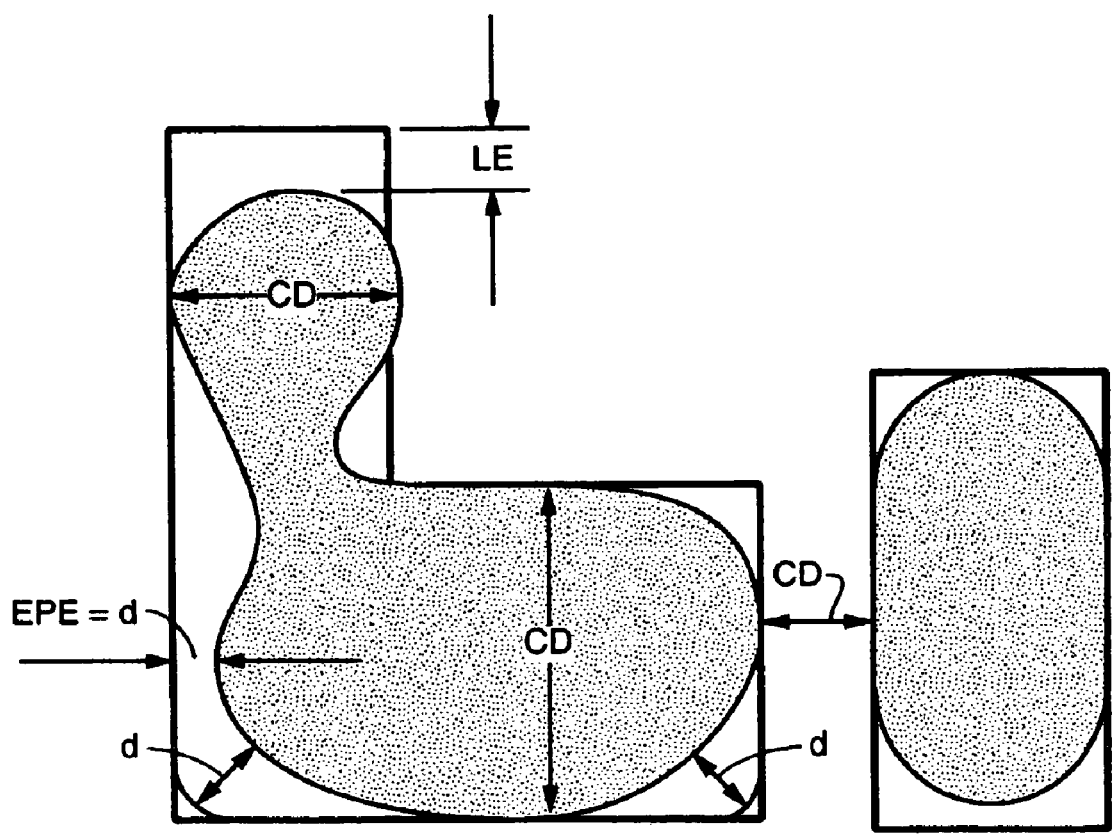
FIG._1

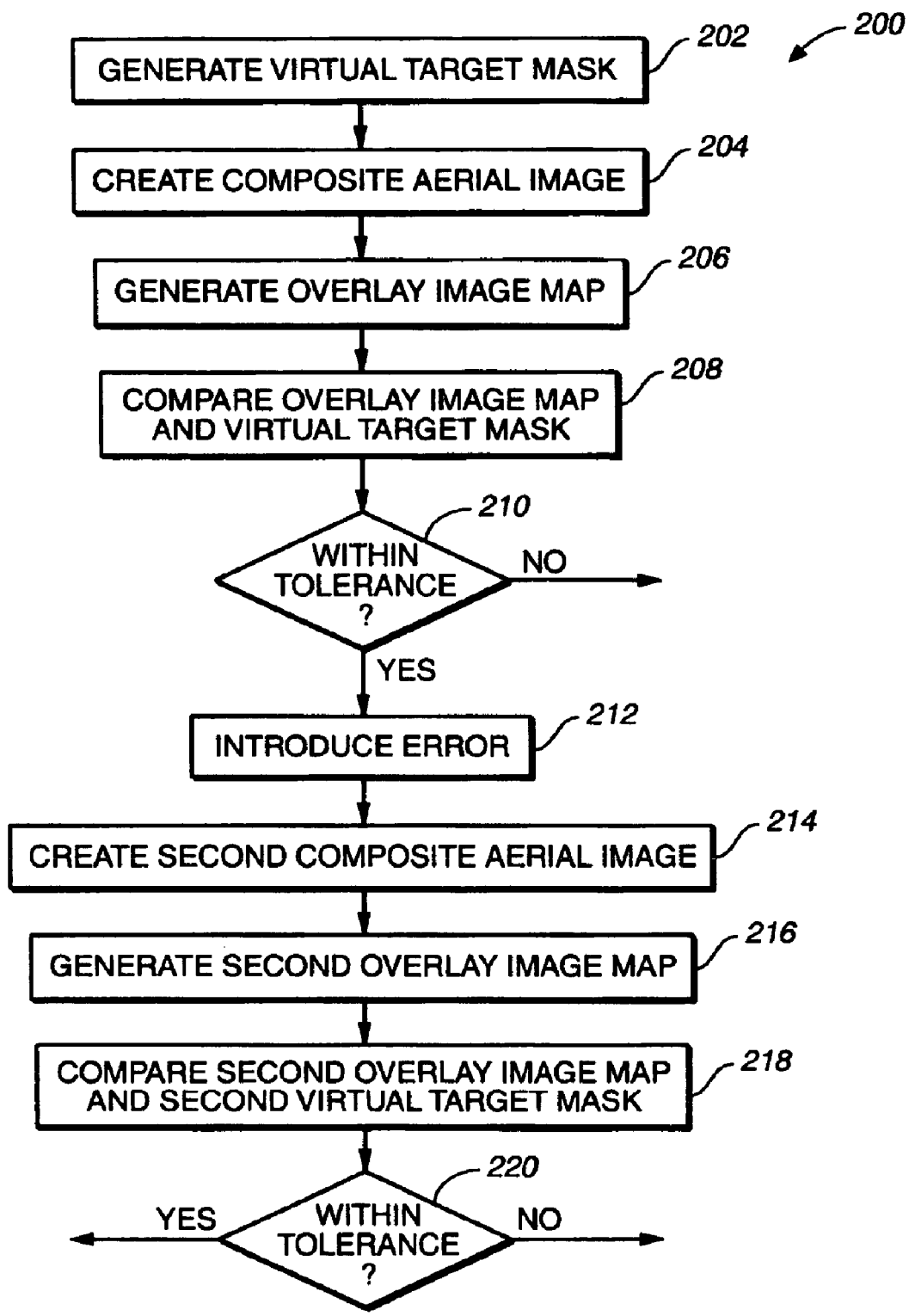
FIG._2

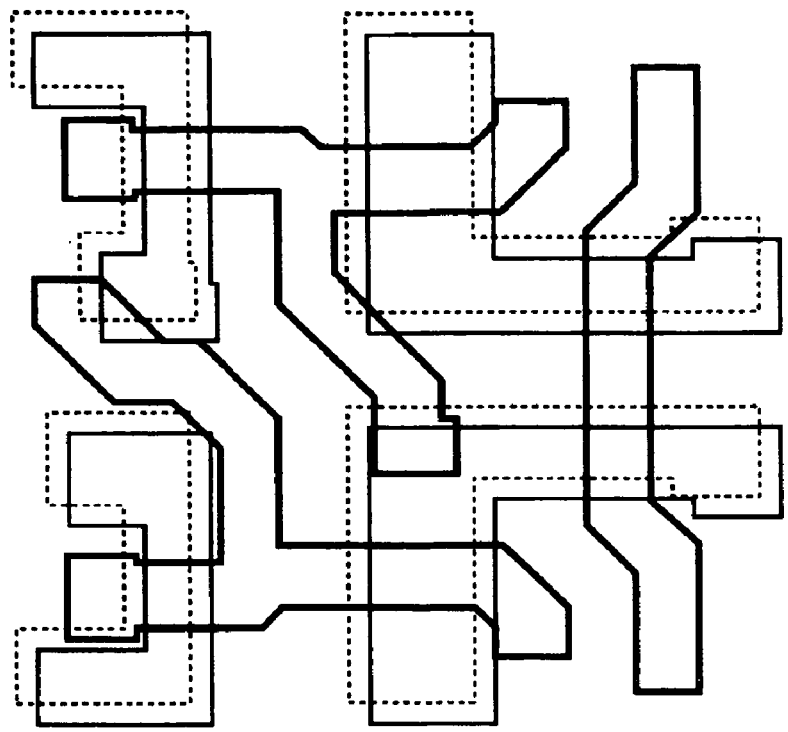
FIG._3B
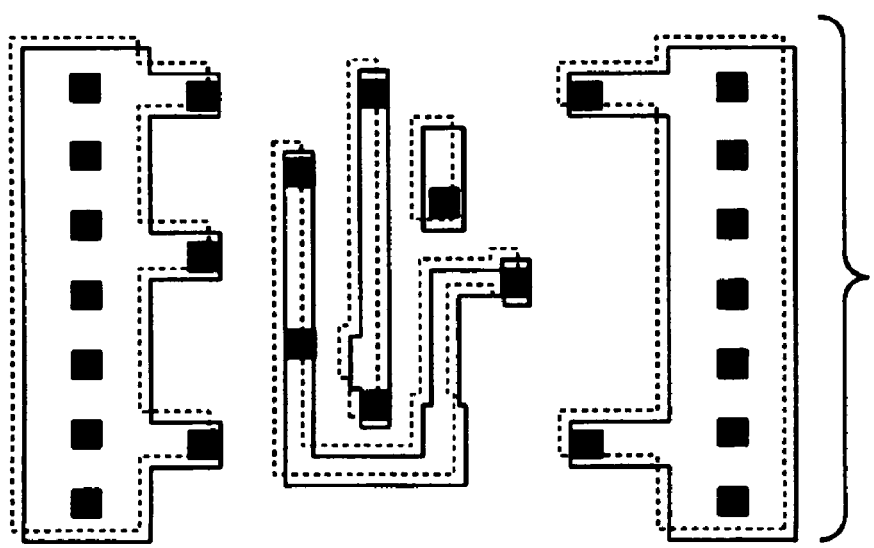
FIG._3A

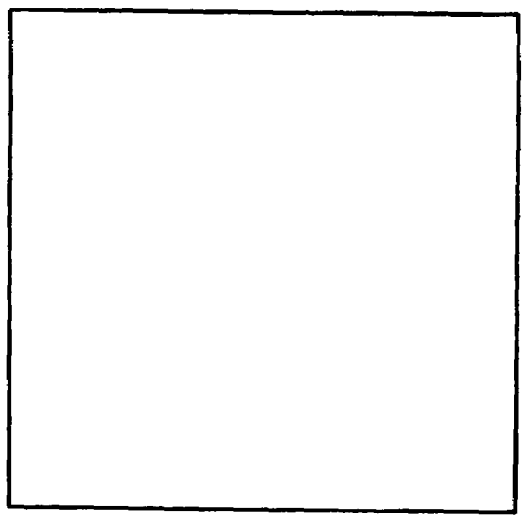
FIG._4A
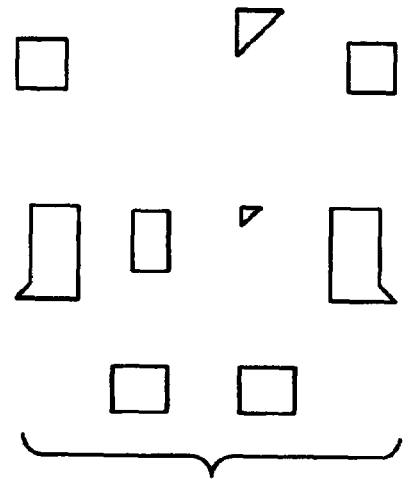
FIG._4B
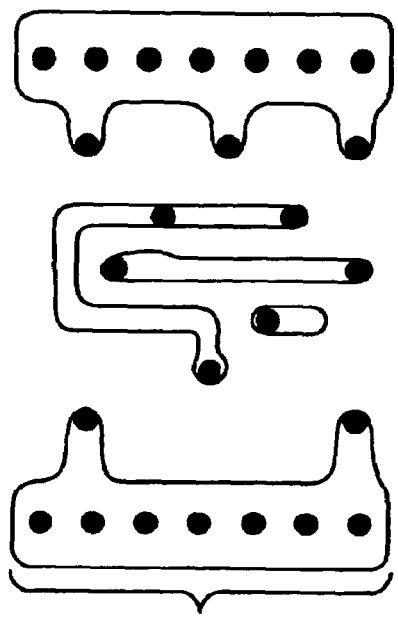
FIG._5A
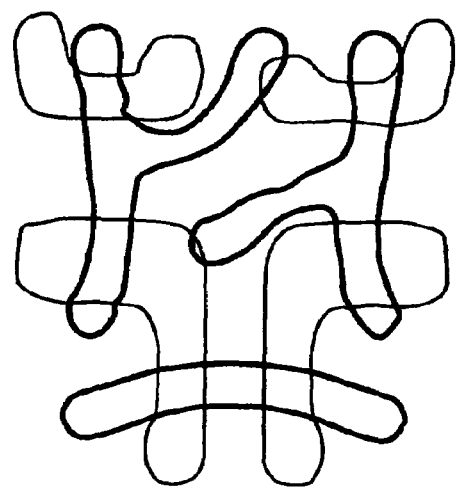
FIG._5B

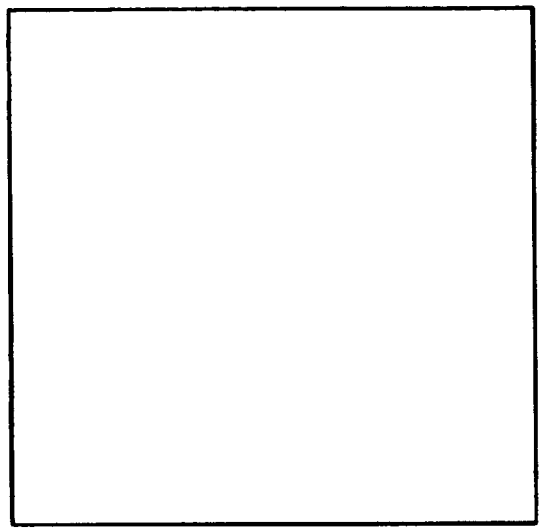
FIG._6A
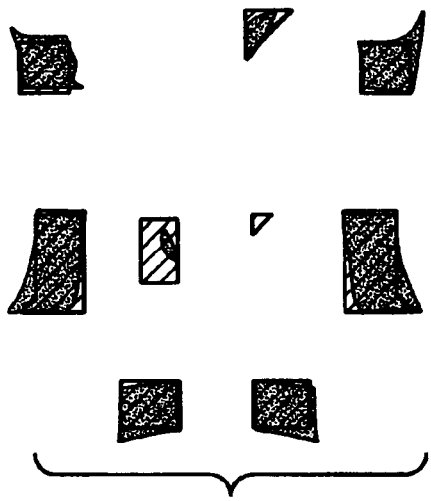
FIG._6B
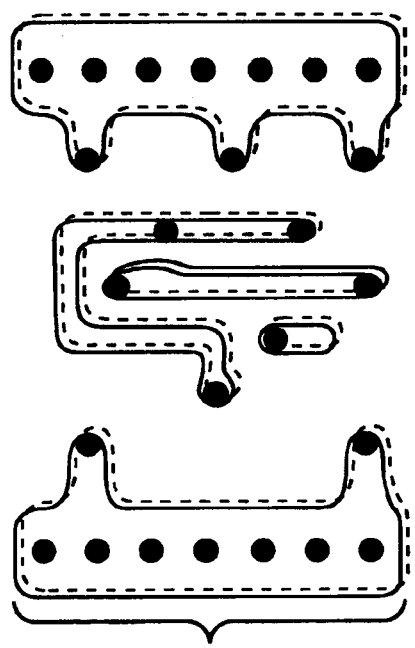
FIG._7A
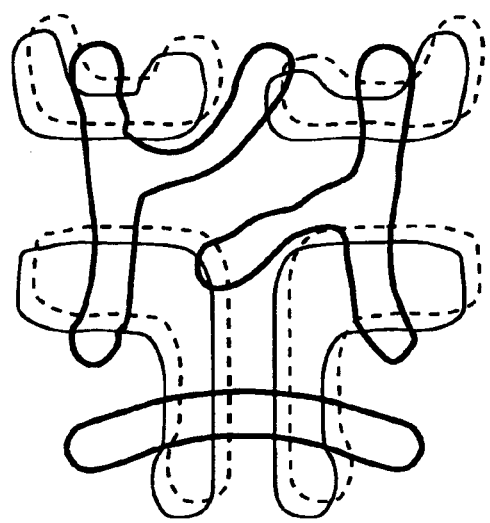
FIG._7B

METHOD FOR POST-OPC MULTI LAYER OVERLAY QUALITY INSPECTION

CROSS-REFERENCE TO RELATED APPLICATIONS

The present application is a continuation-in-part of U.S. patent application Ser. No. 10/155,620, filed May 22, 2002 now U.S. Pat. No. 7,035,446, which is herein incorporated by reference in its entirety. The present application is also related to U.S. Pat. No. 6,171,731, issued Jan. 9, 2001, which is herein incorporated by reference in its entirety.

FIELD OF THE INVENTION

The present invention generally relates to method for locating deviations from a pattern in a simulated aerial image, and more particularly, to a method of measuring the quality of a simulated multiple layer aerial image overlay.

BACKGROUND OF THE INVENTION

Photolithography is a common technique employed in the manufacture of semiconductor integrated circuit (IC) devices. Photolithography involves selectively exposing regions of a resist coated silicon wafer to a reticle (mask) pattern, and then developing the exposed resist in order to selectively process regions of wafer layers (e.g., regions of substrate, polysilicon, or dielectric).

An integral component of a photolithographic apparatus is a "reticle" or "mask" which includes a pattern corresponding to features at one layer in an IC design. Such a mask may typically include a transparent glass plate covered with a patterned light blocking material such as chromium. The mask may be placed between a radiation source producing radiation of a pre-selected wavelength and a focusing lens which may form part of a "stepper" apparatus. Placed on the stepper stage may be a resist covered silicon wafer. When the radiation from the radiation source is directed onto the mask, light may pass through the glass (regions not having chromium patterns) and project onto the resist covered silicon wafer. In this manner, an image of the mask may be transferred to the resist. The resist (sometimes referred to as a "photoresist") is provided as a thin layer of radiation-sensitive material that is spin-coated over the entire silicon wafer surface.

As light passes through the mask, the light may be refracted and scattered by the chromium edges. This may cause the projected image to exhibit some rounding and other optical distortion. While such effects pose relatively little difficulty in layouts with large feature sizes processed with the industry available 248 nm exposure systems (e.g., layouts with critical dimensions above about 0.35 micron), the effects may not be ignored in layouts having features smaller than about 0.18 micron. The problems become especially pronounced in IC designs having feature sizes near or below the wavelength of light used in the photolithographic process. Optical distortions commonly encountered in photolithography may include rounded corners, reduced feature widths, fusion of dense features, shifting of line segment positions, and the like. Any distorted illumination pattern may propagate to a developed resist pattern and ultimately to IC features such as polysilicon gate regions, vias in dielectrics, and the like. As a result, the IC performance may be degraded or the IC may become unusable.

To remedy this problem, a mask correction technique known as optical proximity correction ("OPC") has been developed. OPC may involve adding regions to and/or subtracting regions from a mask design at locations chosen to overcome the distorting effects of diffraction and scattering. Manual OPC has been in existence for many years. Using manual OPC, an engineer may need to add regions using trial and error techniques until the desired pattern on the wafer is obtained. While manual OPC has been effective, as the dimensions of critical features shrink, it has become apparent that the manual approach is not time/cost effective. Therefore, a systematic way is needed to enable fast processing of large, complex chips. Generally speaking, there are currently two automated approaches to OPC: (1) rule-based OPC (use geometric rules to add corrections); and (2) model-based OPC (use lithography simulations to decide corrections). Rule-based OPC is an extension of the methods used for manual OPC. Through experiment or simulation, the corrections that should be applied in a given geometrical situation may be discovered. Then, a pattern recognition system may be used to apply the corrections wherever that geometrical situation occurs throughout the entire layout design. Model-based OPC is different from rule-based OPC in that simulation models are used to predict the wafer results and modify pattern edges on the mask to improve the simulated wafer image. The lithography simulators have traditionally used aerial image contours and cutlines for analysis of IC pattern imaging quality. Methods for simulating the aerial image, for example, as described in U.S. Pat. No. 6,171,731, are used in OPC techniques to modify the reticle pattern until the resulting simulated aerial image is within a selected tolerance from the ideal boundary of the chip design.

However, the ultimate quality of the optical proximity correction is affected not only by the refinement of the mask pattern image to be as accurate as possible to the drawn mask layout, but also by the multi mask overlay quality. Mask overlay requirements are defined by a set of design rules and device functions. The design rules account for possible mask misalignments and critical dimension (CD) errors. Violating the overlap design rules can result in failure of the IC (e.g., CMOS failure). Consequently, it is desirable to provide an effective metrology and method for measuring the multi-layer overlay quality by measuring the impact of multi-mask misalignments and post-OPC mask critical dimension (CD) variations.

SUMMARY OF THE INVENTION

Accordingly, the present invention is directed to a method for performing post-optical proximity correction (OPC) multi layer overlay quality inspection. In exemplary embodiments, the method includes the steps of generating a virtual target mask for a first mask and a second mask overlay using design rules at least partially defining the relationship between the first mask and the second mask; creating a composite aerial image representing a first mask image formed from the first mask and a second mask image formed by the second mask by performing imaging of the first mask and the second mask and overlaying the second mask image onto the first mask image; generating an overlay image map of the composite aerial image using the design rules at least partially defining the relationship between the first mask and the second mask; and comparing the overlay image map area and the virtual target mask area. The method may further include the steps of introducing an overlay error such as an alignment error, rotational error, magnification error, or the like, in the second mask; creating a second composite aerial image representing the first mask image and the second mask image having the introduced error by performing imaging of the first mask and the second mask having the introduced error and overlaying the second mask image having the introduced error onto the first mask image; generating a second overlay image map of the second composite aerial image using the predetermined design rules defining the relationship between the first mask and the second mask having the introduced error; and comparing the second overlay image map area and the virtual target mask area. In a specific embodiment of the invention, the method may be implemented as computer-executable instructions stored in a computer-readable medium. The method may be used to refine one or more masks used in the manufacture of semi-conductor integrated circuit devices.

It is to be understood that both the foregoing general description and the following detailed description are exemplary and explanatory only and are not necessarily restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a diagram illustrating an ideal boundary of a target design and a boundary of a simulated aerial image providing post-OPC two dimensional quality definitions used in the description of the present invention;

FIG. 2 is a flow diagram illustrating a method for post OPC multi layer overlay quality inspection in accordance with an exemplary embodiment of the present invention;

FIG. 3A is a diagram illustrating an exemplary contact/metal mask overlay in accordance with the present invention;

FIG. 3B is a diagram illustrating an exemplary diffusion/poly mask overlay in accordance with the present invention;

FIG. 4A is a diagram illustrating an exemplary contact/metal post-OPC mask overlay virtual target mask corresponding to the required contact/metal mask relationship illustrated in FIG. 3A;

FIG. 4B is a diagram illustrating an exemplary diffusion/poly post-OPC mask overlay virtual target mask corresponding to the required diffusion/poly mask relationship illustrated in FIG. 3B;

FIG. 5A is a diagram illustrating an exemplary contact/metal post-OPC mask composite aerial image overlay created by imaging of the contact/metal masks illustrated in FIG. 3A;

FIG. 5B is a diagram illustrating an exemplary diffusion/poly post-OPC mask composite aerial image overlay created by imaging of the diffusion/poly masks illustrated in FIG. 3B;

FIG. 6A is a diagram illustrating an exemplary contact/metal post-OPC mask overlay image map of the composite aerial image generated using the design rules at least partially defining the relationship between the first mask and the second mask;

FIG. 6B is a diagram illustrating an exemplary diffusion/poly post-OPC mask overlay image map of the composite aerial image generated using the design rules at least partially defining the relationship between the first mask and the second mask;

FIG. 7A is a diagram illustrating an exemplary contact/metal post-OPC mask composite aerial image overlay created by imaging of the contact/metal masks illustrated in FIG. 3A wherein an alignment error has been introduced; and FIG. 7B is a diagram illustrating an exemplary diffusion/poly post-OPC mask composite aerial image overlay created by imaging of the diffusion/poly masks illustrated in FIG. 3B wherein an error (i.e., an alignment error) has been introduced.

DETAILED DESCRIPTION OF THE INVENTION

Reference will now be made in detail to the presently preferred embodiments of the invention, examples of which are illustrated in the accompanying drawings.

FIG. 1 illustrates an ideal boundary of a target design and a boundary of a simulated aerial image (shaded) providing post-OPC two dimensional quality definitions used in the description of the present invention. The aerial image represents substantially the optical information contained in the reticle pattern that is recorded in the photoresist layer of a semiconductor wafer. A simulated aerial image may be used for correcting mask pattern deviations resulting from optical proximity effects, and to find the locations in the reticle pattern that result in the worst case error.

Two-dimensional (2D) quality definitions and applications for post-OPC inspection are described more fully in U.S. patent application Ser. No. 10/155,620 filed May 22, 2002, titled "Quality Measurement of an Aerial Image" (hereinafter, "the '620 application") which is herein incorporated by reference in its entirety. The '620 application describes two-dimensional quality metrology and algorithms for inspecting the quality of a post-OPC mask relative to a drawn or target design. The two-dimensional quality of an optical proximity mask correction is defined as a match between the corrected mask image area or aerial image and the target polygon area or target design.

The ultimate quality of an optical proximity correction (OPC) is defined not only by obtaining the mask pattern image as accurate as possible to a drawn mask layout, but also by a multi mask overlay quality. Mask overlay requirements are defined by a set of design rules (DR) and device functions. The design rules preferably account for possible mask misalignments, critical dimension (CD) errors, end of line errors (LE), Edge Placement Error (EPE), or the like. Violation of the design rules, particularly for overlap, can result in CMOS circuit failure.

Referring generally to FIGS. 2 through 7B, a method 200 for performing post OPC multi-layer overlay quality inspection is described. The method extends the post OPC mask two-dimensional (2D) quality definitions and applications described in the discussion of FIG. 1 for measuring the quality of two or more mask overlays. In this manner, the method 200 provides an effective metrology for measuring an impact of multi-mask misalignments and post-OPC mask CD variations (hereinafter the "multi-layer overlay quality").

As shown in FIG. 2, a virtual target mask is generated, at step 202, for a first mask and a second mask overlay using design rules at least partially defining the relationship between the first mask and the second mask. In exemplary embodiments, a region of interest of overlaying masks may be created by generating a layer derived from the design rules and/or function requirements for two or more specific layer overlays. For example, a particular 0.13 micron design rule (DR) may provide that the minimum contact-to-metal overlap is zero ("0"), the minimum via-to-metal_2 overlap is 10-5 nanomicron (nm), the minimum metal line extension beyond the via hole is 55 nm, and the minimum island-to-poly extension is 300 nm.

The relationship between the first mask and the second mask may comprise a Boolean operation. For example, FIGS. 3A and 3B illustrate, respectively, an exemplary contact/metal mask overlay and an exemplary diffusion/poly mask overlay in accordance with the present invention. Depending on the function of the layer-to-layer overlay, the virtual target mask derived for overlay qualification, may be generated by different Boolean operations. Thus, the contact/metal mask overlay for the layers shown in FIG. 3A may be defined by a Boolean operation NOT, which describes full coverage of contact holes by metal interconnects. Similarly, the diffusion/poly mask overlay comprises a transistor area; defined by a Boolean operation AND. Thus, the derived virtual target mask for layers in FIG. 3A may be expressed "Mask 1 NOT Mask 2" while the derived virtual target mask for layers in FIG. 3B may be expressed "Mask 1 AND Mask 2". Misalignment of the masks is shown, schematically, in dashed lines. FIG. 4A illustrates the resulting contact/metal post-OPC mask overlay virtual target mask corresponding to the required contact/metal mask relationship illustrated in FIG. 3A. Similarly, FIG. 4B illustrates the resulting diffusion/poly post-OPC mask overlay virtual target mask corresponding to the required diffusion/poly mask relationship illustrated in FIG. 3B.

A composite aerial image representing a first mask image formed from the first mask and a second mask image formed by the second mask is next generated, at step 204, by performing imaging of the first mask and the second mask and overlaying the second mask image onto the first mask image. An overlay image map of the composite aerial image may then be generated, at step 206, using the design rules at least partially defining the relationship between the first mask and the second mask. FIGS. 5A and 5B, illustrate exemplary contact/metal and diffusion/poly post-OPC mask composite aerial images created by imaging of the contact/metal and diffusion/poly masks illustrated in FIGS. 3A and 3B.

The overlay image map area is next compared to the virtual target mask area, at step 208. A determination is made, at step 210, whether the overlay image map within a predetermined tolerance of the virtual target mask. For example, in one embodiment, the area of the overlay image maps may be calculated and compared to the area of the derived virtual target mask. The multiple-layer (two-layer) OPC with no reticle/alignment/process error is qualified if the overlay image map area and the virtual target mask area are equal within a certain tolerance. Additionally, one-dimensional quality metrics such as critical dimension (CD) errors, end of line errors (LE), Edge Placement Error (EPE), and the like may be determined and compared with predetermined tolerance values defined by the set of design rules (DR).

In exemplary embodiments, the Boolean operations used for defining the relationship between the first mask and the second mask, shown in FIGS. 3A and 3B, may be applied to create an overlay image map which is compared, at step 208, to the virtual target mask created in step 204. FIGS. 6A and 6B illustrate exemplary contact/metal and diffusion/poly post-OPC overlay image maps of the composite aerial image generated using the design rules defining the relationship between the first mask and the second mask as shown in FIGS. 3A and 3B. The overlay image maps are shown overlaid onto the virtual target masks shown in FIGS. 4A and 4B for comparison.

If the overlay image map is determined to be out of tolerance, at step 210, appropriate corrective action may be taken, including, but not limited to, refinement of one or more of the mask layouts. However, if the overlay image map is determined to be within tolerance, at step 210, an overlay error such as an alignment error, rotational error, magnification error, or the like, is introduced in the second mask, at step 212. A second composite aerial image representing the first mask image and the second mask image having the introduced error is then created, at step 214, by performing imaging of the first mask and the second mask having the introduced error and overlaying the second mask image having the introduced error onto the first mask image. A second overlay image map of the second composite aerial image is also generated, at step 216, using the predetermined design rules defining the relationship between the first mask and the second mask having the introduced error.

FIGS. 7A and 7B illustrate exemplary contact/metal and diffusion/poly post-OPC mask composite aerial images created by imaging of the contact/metal and diffusion/poly masks illustrated in FIGS. 3A and 3B wherein an error, specifically, an alignment error) has been introduced. In FIGS. 7A and 7B, the alignment error is introduced by moving a mask image by a certain value in x- and y-directions shown by dashed lines in FIGS. 3A and 3B. It will be appreciated by those of skill in the art that other types of errors, such as rotational errors, magnification errors, or the like, may also be introduced without departing from the scope and intent of the present invention. Exemplary errors that may be introduced in accordance with the present invention are illustrated by Michael Quirk and Julian Serda, *Semiconductor Manufacturing Technology* (1st edition, 2000), which is herein incorporated by reference in its entirety.

The second overlay image map area and the virtual target mask area are compared, at step 218. A determination is made, at step 210, whether the overlay image map within a predetermined tolerance of the virtual target mask. For example, in one embodiment, the area of the overlay image maps may be calculated and compared to the area of the derived virtual target mask. Additionally, one-dimensional quality metrics such as critical dimension (CD) errors, end of line errors (LE), Edge Placement Error (EPE), and the like may be determined and compared with predetermined tolerance values defined by the set of design rules (DR). The maximum of the misalignment errors ("$\Delta x$" and "$\Delta y$") provide a minimum acceptable discrepancy between the target areas and the skewed mask image overlay areas, defines an alignment layer-to-layer tolerance for a prospective technology.

In embodiments of the invention, the method may be used to refine one or more masks used in the manufacture of semi-conductor integrated circuit devices, and the like. Moreover, the method 200 may be implemented into an integrated flow for statistical analysis and sensitivity of the post-OPC mask multi-layer overlay quality affected by reticle noise, mask alignment errors, process condition (dose/focus) variations across the wafer on which the semiconductor integrated circuit devices are formed, and the like.

The method 200 may be implemented as computer-executable instructions or software stored in a computer-readable medium. Further, it is understood that the specific order or hierarchy of steps in the method 200 disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not necessarily meant to be limited to the specific order or hierarchy presented.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for performing post-optical proximity correction (OPC) multi layer overlay quality inspection, comprising:
   generating a virtual target mask for a first mask and a second mask overlay using design rules at least partially defining the relationship between the first mask and the second mask;
   creating a composite aerial image representing a first mask image formed from the first mask and a second mask image formed by the second mask by performing imaging of the first mask and the second mask and overlaying the second mask image onto the first mask image;
   generating an overlay image map of the composite aerial image using the design rules at least partially defining the relationship between the first mask and the second mask; and
   comparing the overlay image map area and the virtual target mask area, wherein the step of comparing the overlay image map area and the virtual target mask area comprises:
   calculating the area of the overlay image map;
   calculating the area of the virtual target mask; and
   determining if the area calculated for the overlay image map matches the area calculated for the virtual target mask within the predetermined tolerance.

2. The method as claimed in claim 1, further comprising:
   introducing an overlay error in the second mask;
   creating a second composite aerial image representing the first mask image and the second mask image having the introduced error by performing imaging of the first mask and the second mask having the introduced error and overlaying the second mask image having the introduced error onto the first mask image;
   generating a second overlay image map of the second composite aerial image using the predetermined design rules defining the relationship between the first mask and the second mask having the introduced error; and
   comparing the second overlay image map area and the virtual target mask area.

3. The method as claimed in claim 2, wherein the introduced overlay error comprises at least one of an alignment error, a rotational error, a magnification error, or the like.

4. The method as claimed in claim 2, wherein the step of comparing the second overlay image map area and the virtual target mask area comprises:
   calculating the area of the second overlay image map;
   calculating the area of the virtual target mask; and
   determining if the area calculated for the second overlay image map matches the area calculated for the virtual target mask within the predetermined tolerance.

5. The method as claimed in claim 1, wherein the relationship between the first mask and the second mask comprises a Boolean operation.

6. The method as claimed in claim 1, wherein the virtual target mask comprises a diffusion/poly post overlay target.

7. The method as claimed in claim 1, wherein the virtual target mask comprises a contact/metal mask overlay target.

8. A computer-readable medium having computer-executable instructions for executing a method for performing post-optical proximity correction (OPC) multi layer overlay quality inspection, the method comprising:
   generating a virtual target mask for a first mask and a second mask overlay using design rules at least partially defining the relationship between the first mask and the second mask;
   creating a composite aerial image representing a first mask image formed from the first mask and a second mask image formed by the second mask by performing imaging of the first mask and the second mask and overlaying the second mask image onto the first mask image;
   generating an overlay image map of the composite aerial image using the design rules at least partially defining the relationship between the first mask and the second mask; and
   comparing the overlay image map area and the virtual target mask area, wherein the step of comparing the overlay image map area and the virtual target mask area comprises:
   calculating the area of the overlay image map;
   calculating the area of the virtual target mask; and
   determining if the area calculated for the overlay image map matches the area calculated for the virtual target mask within the predetermined tolerance.

9. The computer readable medium as claimed in claim 8, wherein the method further comprises:
   introducing an overlay error in the second mask;
   creating a second composite aerial image representing the first mask image and the second mask image having the introduced error by performing imaging of the first mask and the second mask having the introduced error and overlaying the second mask image having the introduced error onto the first mask image;
   generating a second overlay image map of the second composite aerial image using the predetermined design rules defining the relationship between the first mask and the second mask having the introduced error; and
   comparing the second overlay image map area and the virtual target mask area.

10. The computer readable medium as claimed in claim 9, wherein the introduced error comprises at least one of an alignment error, a rotational error, a magnification error, or the like.

11. The computer readable medium as claimed in claim 9, wherein the step of comparing the second overlay image map area and the virtual target mask area comprises:
   calculating the area of the second overlay image map;
   calculating the area of the virtual target mask; and
   determining if the area calculated for the second overlay image map matches the area calculated for the virtual target mask within a second predetermined tolerance.

12. The computer readable medium as claimed in claim 8, wherein the relationship between the first mask and the second mask comprises a Boolean operation.

13. The computer readable medium as claimed in claim 8, wherein the virtual target mask comprises a diffusion/poly post-OPC mask overlay target.

14. The computer readable medium as claimed in claim 8, wherein the virtual target mask comprises a contact/metal post-OPC mask overlay target.

15. A semi-conductor integrated circuit device manufactured refined masks using a method for performing post-optical proximity correction (OPC) multi layer overlay quality inspection, the method comprising:

generating a virtual target mask for a first mask and a second mask overlay using design rules at least partially defining the relationship between the first mask and the second mask;
 creating a composite aerial image representing a first mask image formed from the first mask and a second mask image formed by the second mask by performing imaging of the first mask and the second mask and overlaying the second mask image onto the first mask image;
 generating an overlay image map of the composite aerial image using the design rules at least partially defining the relationship between the first mask and the second mask; and
 comparing the overlay image map area and the virtual target mask area, wherein the step of comparing the overlay image map area and the virtual target mask area comprises:
 calculating the area of the overlay image map;
 calculating the area of the virtual target mask; and
 determining if the area calculated for the overlay image map matches the area calculated for the virtual target mask within a predetermined tolerance.

16. The semi-conductor integrated circuit device as claimed in claim 15, wherein the method further comprises:
 introducing an overlay error in the second mask;
 creating a second composite aerial image representing the first mask image and the second mask image having the introduced error by performing imaging of the first mask and the second mask having the introduced error and overlaying the second mask image having the introduced error onto the first mask image;
 generating a second overlay image map of the second composite aerial image using the predetermined design rules defining the relationship between the first mask and the second mask having the introduced error; and
 comparing the second overlay image map area and the virtual target mask area.

17. The semi-conductor integrated circuit device as claimed in claim 16, wherein the introduced overlay error comprises at least one of an alignment error, a rotational error, a magnification error, or the like.

18. The semi-conductor integrated circuit device as claimed in claim 16, wherein the step of comparing the second overlay image map area and the virtual target mask area comprises:
 calculating the area of the second overlay image map;
 calculating the area of the virtual target mask; and
 determining if the area calculated for the second overlay image map matches the area calculated for the virtual target mask within a predetermined tolerance.

19. The semi-conductor integrated circuit device as claimed in claim 15, wherein the relationship between the first mask and the second mask comprises a Boolean operation.

20. The semi-conductor integrated circuit device as claimed in claim 15, wherein the virtual target mask comprises a diffusion/poly post-OPC mask overlay target.

21. The semi-conductor integrated circuit device as claimed in claim 15, wherein the virtual target mask comprises a contact/metal post-OPC mask overlay target.

* * * * *